United States Patent [19]
Sakamoto et al.

[11] Patent Number: 5,175,435
[45] Date of Patent: Dec. 29, 1992

[54] ELECTRON BEAM EXPOSURE SYSTEM WITH INCREASED EFFICIENCY OF EXPOSURE OPERATION

[75] Inventors: Kiichi Sakamoto; Shunsuke Fueki; Hiroshi Yasuda, all of Kawasaki, Japan

[73] Assignee: Fujitsu Limited, Kawasaki, Japan

[21] Appl. No.: 782,251

[22] Filed: Oct. 25, 1991

[30] Foreign Application Priority Data

Oct. 26, 1990 [JP] Japan .................................. 2-289173

[51] Int. Cl.⁵ .......................................... H01J 37/302
[52] U.S. Cl. .................................. 250/492.2; 250/398
[58] Field of Search .............................. 250/398, 492.2

[56] References Cited

U.S. PATENT DOCUMENTS

| | | | |
|---|---|---|---|
| 4,151,421 | 4/1979 | Sumi | 250/492.22 |
| 4,259,724 | 3/1981 | Sugiyama | 250/492.22 |
| 4,531,191 | 7/1985 | Koyama | 250/492.22 |
| 4,538,232 | 3/1985 | Koyama | 250/492.22 |
| 4,996,434 | 2/1991 | Tanaka | 250/492.22 |
| 5,051,556 | 9/1991 | Sakamoto et al. | 250/356 ML |

*Primary Examiner*—Bruce C. Anderson
*Attorney, Agent, or Firm*—Staas & Halsey

[57] ABSTRACT

An electron beam exposure system comprises a pattern data generator for producing first pattern data indicative of a desired pattern of electron beam to be written on a wafer and second pattern data indicative of the number of repetitions of the pattern specified by the first pattern data, as a time sequential mixture of the first and second pattern data. The time sequential mixture of the data is sorted in a data sorting unit into a parallel data of the first pattern data and the second pattern data. Then, a discrimination is made whether the data is the first pattern data or the second pattern data, and when the data is the second pattern data, the data that follows immediately behind the second pattern data is transferred to an output path simultaneously with the second pattern data, which is transferred to another output path. Thereby, the first and second pattern data form a parallel data. The parallel data thus formed is next compressed by deleting the data, that follows immediately behind the data which contains the second pattern data, from both output paths.

11 Claims, 12 Drawing Sheets

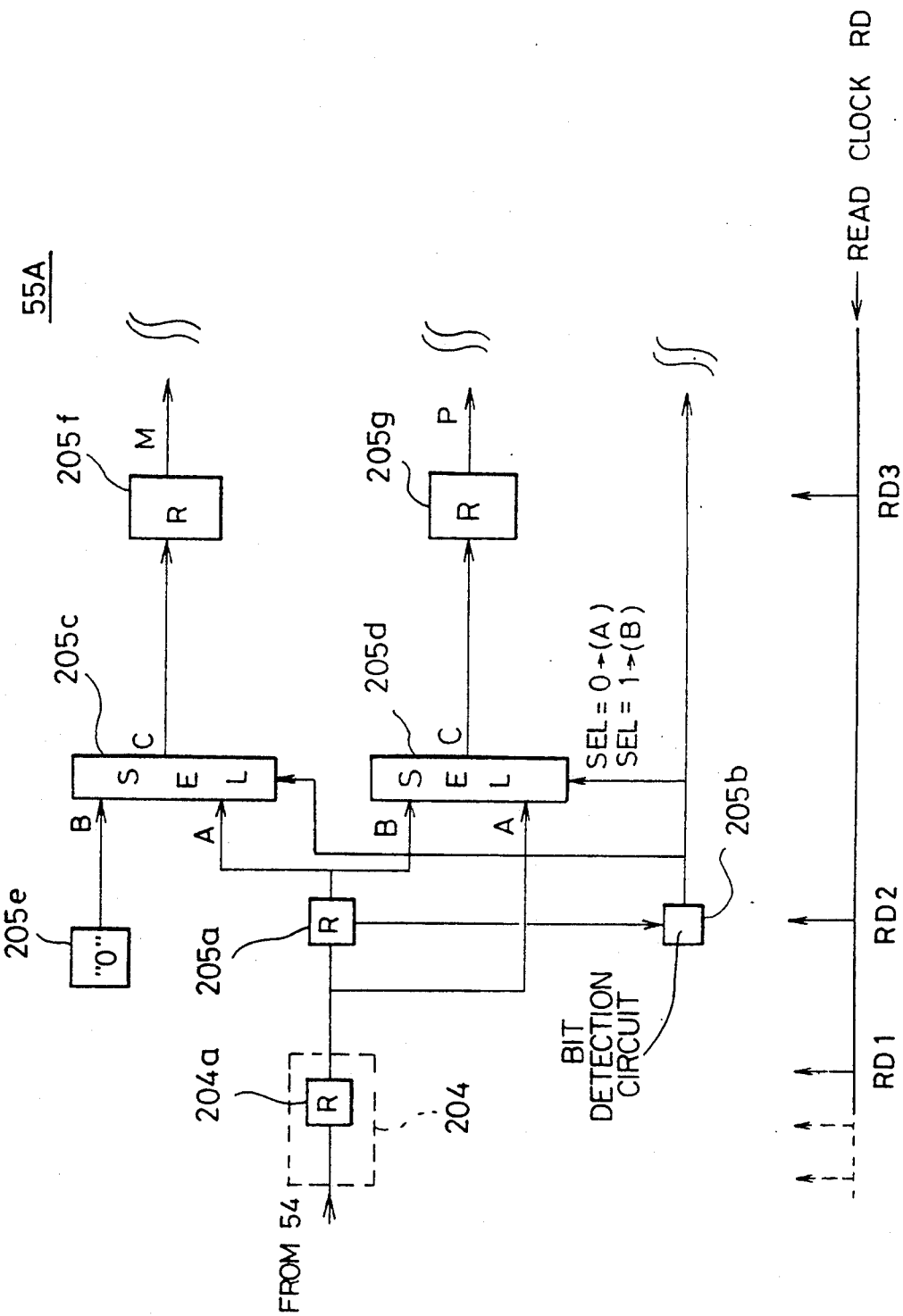

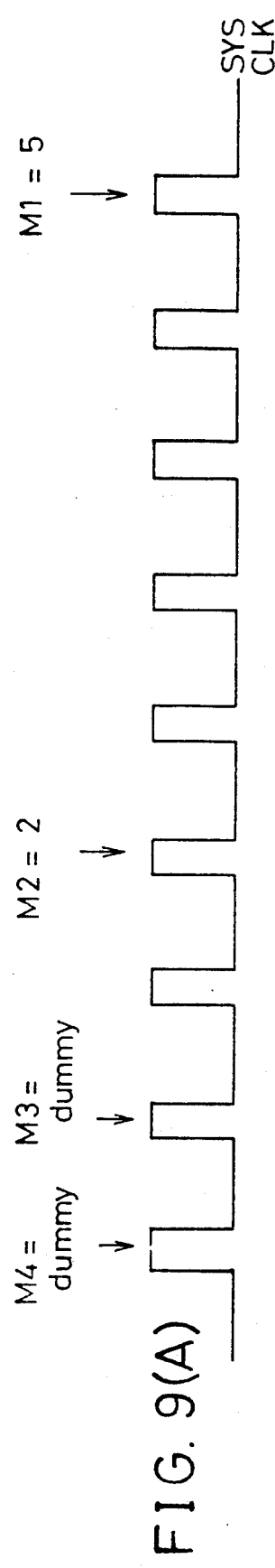
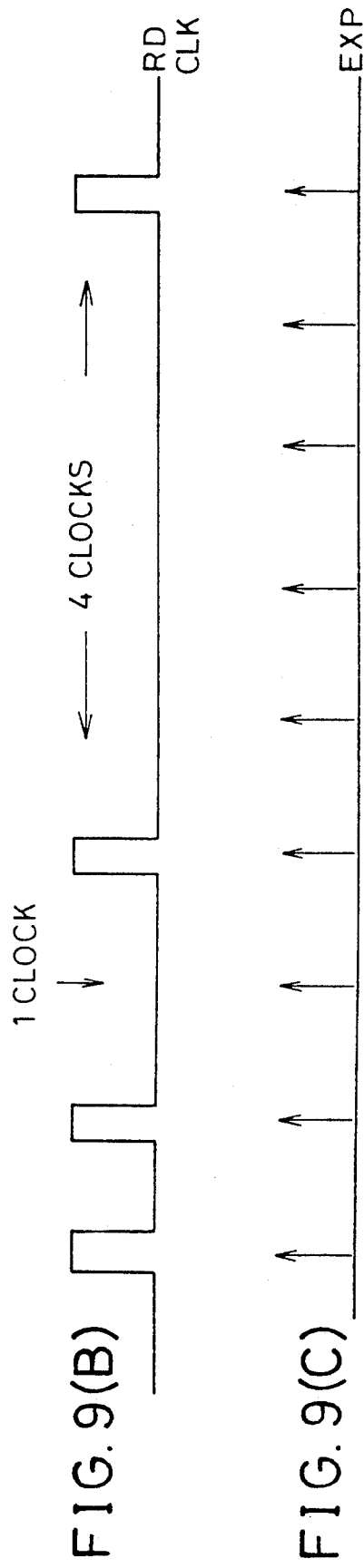
FIG. 9(A)
FIG. 9(B)
FIG. 9(C)

ELECTRON BEAM EXPOSURE SYSTEM WITH INCREASED EFFICIENCY OF EXPOSURE OPERATION

BACKGROUND OF THE INVENTION

The present invention generally relates to electron beam exposure systems and more particularly to an electron beam exposure system for writing a number of patterns on an object consecutively with increased efficiency.

The electron beam exposure system is used for writing submicron patterns on an object such as a semiconductor wafer. In using the electron beam exposure system for mass-producing semiconductor devices having submicron patterns such as LSIs, it is essential that the electron beam exposure system has a large throughput. It should be noted that, as a result of the submicron patterning, enormous numbers of semiconductor devices are formed on the substrate of the LSI. On the other hand, the usual electron beam exposure system generally has a limited throughput originating from the principle of the electron beam exposure that the pattern is written by a single electron beam. In other words, the semiconductor patterns are written on the substrate in one stroke.

In order to achieve the desired high throughput, a technique called a block exposure process is proposed. According to this technique, the electron beam is passed through a suitable electron optic system to form a parallel beam, and the parallel beam thus obtained is passed through an apertured mask for beam shaping. The mask carries thereon a number of fundamental patterns of semiconductor devices in the form of apertures and shapes the electron beam upon passage therethrough. Further, in order to address the desired aperture, the electron beam exposure system includes a deflection system for deflecting the parallel electron beam.

FIG. 1 shows the principle of the block exposure.

Referring to FIG. 1, an electron gun 1 produces an electron beam that is directed to a semiconductor substrate 7 along a predetermined optical axis. Thereby, the electron beam is first passed through a shaping aperture 2 for preliminary shaping and focused on a point located on the optical axis by an electron lens 3. There, the electron beam is deflected by a deflector 4 and hits a predetermined part of a mask 5 that carries a number of apertures 6a–6c corresponding to the fundamental patterns of semiconductor devices. By controlling the deflector 4, one can deflect the electron beam to hit any desired aperture on the mask 5. In other words, one can address the apertures on the mask 5 by the deflector 4.

As a result of the foregoing addressing, the electron beam passes through the mask 5 while being shaped according to the shape of the aperture through which the electron beam has passed. After the shaping thus occurred, the electron beam is deflected back on the optical axis by an electron lens 8 that is formed to surround the mask 5. Further, the electron beam is focused on the surface of the substrate 7 after passing through a demagnification electron optical system 9. Thereby, the demagnified pattern of the aperture on the mask 5 through which the electron beam has passed is exposed on an electron beam resist (not shown) provided on the surface of the substrate 7. According to such a block exposure technique, one can reduce the exposure time significantly as compared to the case for writing each pattern by a finely focused electron beam.

In carrying out the foregoing block exposure, it is necessary to address the apertures on the mask 5 consecutively. On the mask 5, about several hundreds to several thousands of such apertures are formed, and an enormous number of semiconductor devices is exposed on the single substrate 7. Thereby, mere implementation of the block exposure process is not sufficient to achieve the desired throughput. It should be noted that such a simple block exposure process includes the addressing of the apertures on the mask 5 for each exposure on the substrate 7.

In the block exposure process, there occurs frequently the case wherein one aperture pattern is written on a number of different locations on the substrate 7 consecutively. Thus, there is a conventional process to reduce the time needed for the exposure by compressing exposure data for controlling the exposure process, by dividing the exposure data into first type data specifying the apertures on the mask and second type data specifying the number of exposures to be repeated.

FIG. 2 shows a conventional process for implementing the foregoing data compression.

Referring to FIG. 2, the exposure data is held in a storage device 110 and read out therefrom consecutively. The exposure data thus read out is then stored in a FIFO memory 111 and transferred further to a first register 112 therefrom.

Now, the exposure data includes two types of data, first type data P for designating the aperture or pattern, and second type data M for designating the number of repetitions of the exposure, as described above. In order to identify the attribute of the first and second data, the data P and data M carry respective identification flags in a suitable bit thereof.

Once the exposure data that is either of the data P or data M is stored in the register 112, the identification flag is detected by a discrimination part 113, and the discrimination part 113 controls a switch device 114 that is connected to an output port of the register 112 for transferring the data P and the data M respectively to buffer registers 115 and 116. Based upon the data P outputted by the register 115, the addressing of the apertures on the mask 5 is achieved, while the data M is used for moving the substrate 7 and for deflecting the shaped electron beam over the surface of the substrate 7 for repetitive exposure.

In the conventional data compression system of FIG. 2, the data compression occurs as follows.

Assuming a series of exposure data coming in as . . . $P_4/P_3/P_2/M_2/P_1/M_1$ wherein the data $M_1$ comes in first, the content of the registers 115 and 116 changes with time $t_1, t_2, t_3, \ldots$ as follows.

TABLE I

| t6 | t5 | t4 | t3 | t2 | t1 |
|---|---|---|---|---|---|
| 115 | 115 | 115 | 116 | 115 | 116 |
| $P_4$ | $P_3$ | $P_2$ | $M_2$ | $P_1$ | $M_1$ |

As can be seen in the above transition table, the storage of the data P and M into respective registers 115 and 116 is achieved alternately in response to the alternate arrival of the data M and data P. This means that the state of the register 115 remains unchanged when the data M is transferred to the register 116, and the state of the register 116 remains unchanged when the data P is transferred to the register 115. Thus, it will be understood that there exists a loss of time in the operation of the conventional system of FIG. 2. This loss becomes particularly conspicuous when a semiconductor pattern having a large number of repetitions is exposed.

SUMMARY OF THE INVENTION

Accordingly, it is a general object of the present invention to provide a novel and useful electron beam exposure system and an exposure process wherein the foregoing problems are eliminated.

Another and more specific object of the present invention is to provide an electron beam exposure system and an exposure process for writing a pattern on an object by a shaped electron beam, wherein reading of data indicative of the pattern to be exposed and the reading of data indicative of the number of repetitions of the exposure are made simultaneously for accelerating the exposure process.

Another object of the present invention is to provide an electron beam exposure system for writing a pattern on an object by a shaped electron beam, said electron beam exposure system including a data processing system supplied with data of a time-sequential mixture of first type data and second type data consecutively, said first type data specifying the shape of the electron beam, said second type data specifying the repetition of the exposure achieved by said shaped electron beam, wherein the data processing system discriminates the type of the data and outputs the first type data and the second type data in parallel when there is a consecutive appearance of the first type data and the second type data. According to the present invention, the shaping of the electron beam and the exposure by the shaped electron beam are achieved simultaneously, and the exposure of the pattern is achieved in response to each system clock without interruption. More specifically, the exposure is achieved in response to each of the system clocks by changing the shape of the electron beam when the first type data continues, and only when there comes in the second type data, the exposure by the same pattern is repeated in response to the system clock by the number of repetitions that is specified by the second type data. Thereby, the exposure itself is repeated without interruption.

Other objects and further features of the present invention will become apparent from the following detailed description when read in conjunction with the attached drawings.

BRIEF DESCRIPTION OF THE DRAWINGS

FIG. 5 is a diagram showing the principle of operation of the control system part shown in FIG. 4;

FIGS. 9(A)–9(C) are timing charts showing the formation of clocks used in the system of FIG. 8.

DETAILED DESCRIPTION

Figure 1:
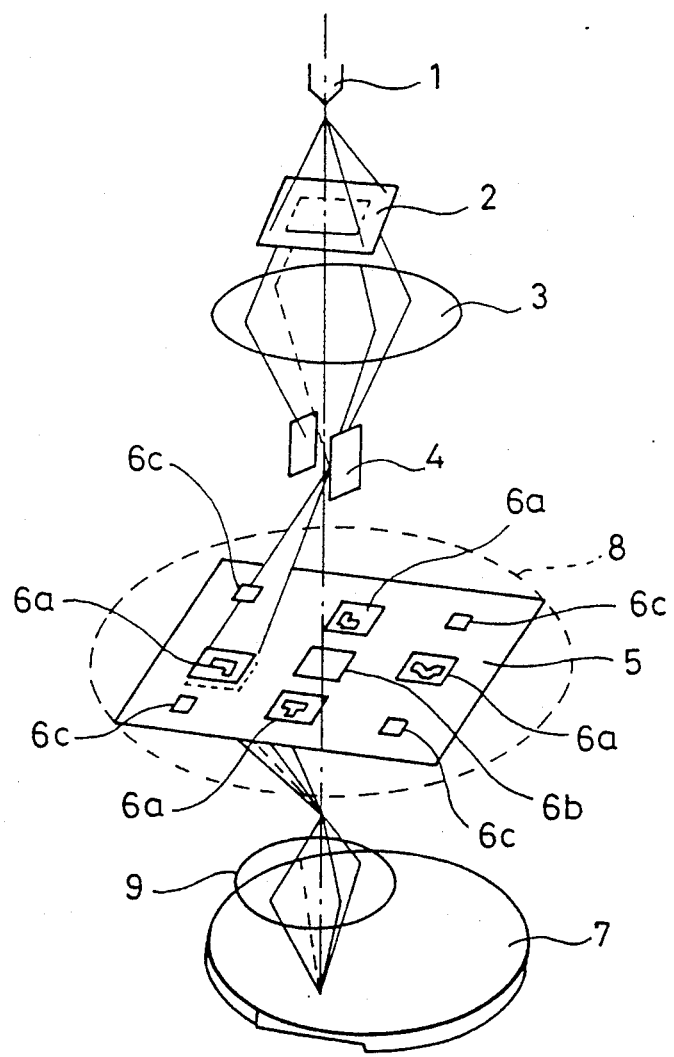
FIG. 1 is a diagram showing the conventional construction of an electron exposure system that uses the block exposure process for increasing the throughput of exposure.
Figure 2:
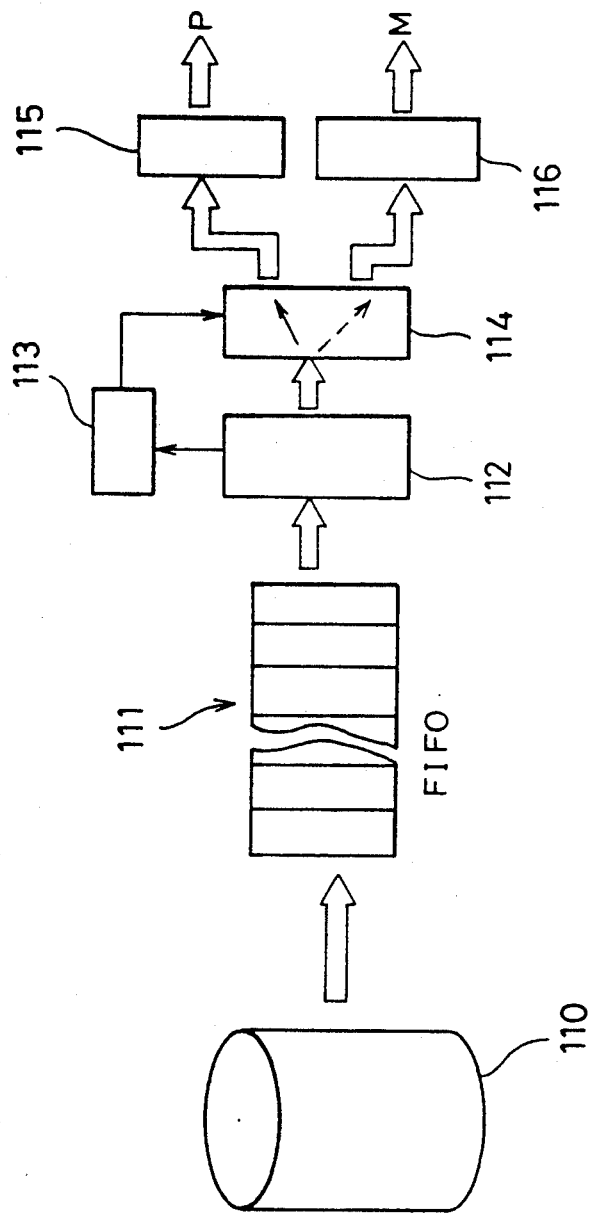
FIG. 2 is a diagram showing the conventional construction of a control system used in the block exposure system of FIG. 1 for maximizing the throughput of exposure.
Figure 3:
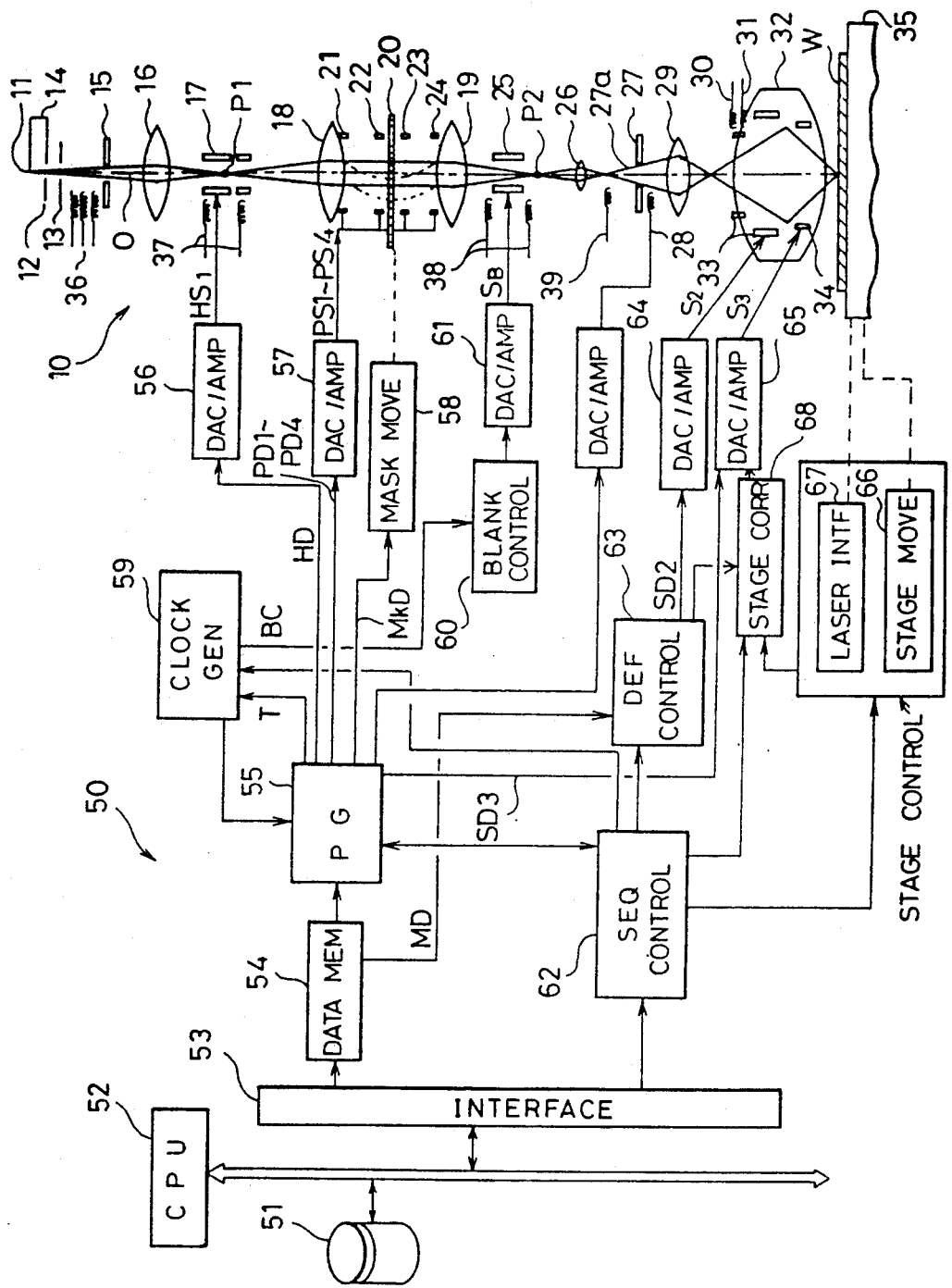
FIG. 3 is a diagram showing the overall construction of the electron beam exposure system according to an embodiment of the present invention.

FIG. 3 shows the overall construction of the electron beam exposure system according to an embodiment of the present invention.

Referring to FIG. 3, the electron beam exposure system includes an optical system 10 for carrying out the exposure by an electron beam and a control system 50 for controlling the exposure operation.

The optical system 10 includes an electron gun 14 that in turn is formed from a cathode electrode 11 for emitting thermal electrons, an anode electrode 13 for accelerating the electrons to form an electron beam and a grid electrode 12 for controlling the flow of the electrons from the cathode electrode 11 to the anode electrode 13. Thereby, the electron beam produced by the electron gun propagates generally in the direction of a target or object W held on a movable stage 35 as a divergent beam.

The divergent electron beam thus produced is then passed through a shaping aperture formed in a plate 15 to have a desired cross section and directed to travel in coincidence with a predetermined optical axis 0 that extends from the cathode electrode 11 to an object W on which a pattern is to be written. Typically, the object W is a semiconductor substrate. In order to achieve the desired alignment of the electron beam with respect to the optical axis 0, adjustment coils 36, 37, 38 and 39 are provided along the optical axis 0.

The electron beam thus shaped by the aperture plate 15 is then focused on a point P1 located on the optical axis 0 by a first electron lens 16. In correspondence to the point P1, there is provided a deflector 17 that deflects the electron beam in response to a control signal HS1 supplied thereto such that the electron beam hits a block mask to be described later.

The electron beam is then received by a second electron lens 18 that has a focal point coincident to the point P1 and is converted to a parallel electron beam. This parallel electron beam is then passed through a block mask 20 on which a plurality of apertures for shaping the electron beam are formed. Upon passage through a selected aperture, it is possible to shape the electron beam such that the electron beam has a desired cross section.

In order to address the apertures on the block mask 20, a pair of deflectors 21 and 22 are provided above the mask 20 such that the parallel electron beam is once deflected away from the optical axis 0 and deflected back to travel in the direction parallel to the optical axis 0. Further, in order to return the electron beam in coincidence with the optical axis 0, another pair of deflectors 23 and 24 are provided below the mask 20. It should be noted that the deflectors 21–24 cause the foregoing deflection and hence the addressing of the selected aperture in response to deflection control signals PS1-PS4 that are supplied thereto.

The parallel electron beam thus returned to the optical axis 0 is then passed through an electron lens 19 and focused at a point P2 located on the optical axis 0. The electron beam is then passed through a demagnification optical system including an electron lens 26 and another electron lens 29, and focused on the wafer W by an objective lens 32. Thereby, the image of the selected aperture on the mask 20 is projected on the upper surface of the wafer W.

In the objective lens 32, various coils and deflectors such as a dynamic focusing coil 30 and a dynamic astigmatic coil 31 are provided for focusing correction and astigmatic correction. Further, there are provided deflectors 33 and 34 that deflect the focused electron beam on the wafer W such that the electron beam moves over the wafer W, wherein the deflector 33 causes a moving of the beam spot for a distance of about 2 mm × 2 mm in the maximum, while the deflector 34 is used to deflect the electron beam within the area of about 100 $\mu$m × 100 $\mu$m. Furthermore, a refocusing coil 28 for additional focusing control is provided above the electron lens 29.

In order to control the turning on and turning off of the electron beam on the wafer W, a blanking aperture plate 27 is provided between the electron lens 26 and the electron lens 29 for passing the electron beam through a blanking aperture 27a that is formed therein in coincidence with the optical axis 0. The blanking aperture 27a has a reduced diameter and the plate 27 interrupts the electron beam when the electron beam is deflected away from the optical axis 0. Thereby, the electron beam disappears from the surface of the wafer W.

In order to effect such a turning-on and turning-off of the electron beam, a blanking deflector 25 is provided between the lens 19 and the plate 27, and the blanking deflector 25 deflects the electron beam away from the optical axis 0 in response to a blanking control signal SB supplied thereto.

Next, the control system 50 for controlling the optical system 10 will be described.

Referring to FIG. 3 again, the control system 50 includes a magnetic storage device 51 that stores various design data of the semiconductor device or integrated circuit to be formed on the wafer W and a CPU 52 that controls the optical system 10. The CPU 52 reads the pattern information of the semiconductor device such as the pattern data, the positional data indicating the location on the wafer W on which the pattern data is to be written, the mask information indicating the array of the apertures on the block mask 20, etc. The pattern information and the mask information thus read out from the storage device 51 are transferred on the one hand to a data memory 54 and on the other hand to a sequence controller 62 via an interface circuit 53.

The data memory 54 stores the pattern information and the mask information and transfers the same to a pattern generator 55 that generates deflection control data PD1-PD4 in response to the pattern information and the mask information supplied thereto. The deflection control data PD1-PD4 are sent to a D/A converter 57 where they are converted to the analog deflection control signals PS1-PS4. Thereby, the selection of the apertures on the mask 20 is achieved as already described. The pattern generator 55 further produces positional data SD3 indicative of the location of the wafer W on which the exposure is to be made. The data SD3 is sent to a D/A converter 65 where it is converted to an analog signal S3 that drives the sub-deflector 34 in the objective lens 32.

The pattern generator 55 further produces correction data HD indicative of the difference in the desired pattern and the selected pattern on the mask 20 and supplies the same to a D/A converter 56 where the data HD is converted to a control signal HS1 that drives the deflector 17. In response to the control signal HS1, the electron beam is moved over the block mask 20 and additional shaping is achieved by offsetting the electron beam slightly from the selected aperture. For example, the variable shaping of the electron beam is achieved by the deflector 17. Further, the deflector 17 achieves the deflection of the electron beam in the limited area typically having a size of 500 $\mu$m × 500 $\mu$m with a high speed. The deflectors 21-24 are used, on the other hand, for the deflection of the electron beam for a relatively large, area typically of the size of about 5 mm × 5 mm, though with reduced speed. Typically, the deflector 17 is constructed by an electrostatic deflector while the deflectors 21-24 are constructed by electromagnetic deflectors.

Additionally, the pattern generator 55 produces control data MKD for moving the block mask 20 and supplies the same to a mask drive mechanism 58. The mask drive mechanism 58 moves the mask 20 in response to the control data MD in a plane substantially perpendicular to the optical axis 0. Thereby, the entirety of the apertures on the mask 20 can be addressed by the electron beam by moving the mask 20 such that the specified aperture moves into the area where the addressing can be achieved by the deflection of the electron beam. Further, the pattern generator 55 produces a control signal for driving the refocusing coil 28 and supplies the same to the coil 28 via a D/A converter 28. Thereby, the proper focusing on the surface of the wafer W is maintained even when the electron beam is deflected by the deflectors 33 and 34.

The pattern generator 55 produces a timing signal T for indicating execution of the exposure or waiting for the exposure. The timing signal T is supplied to a clock control circuit, or generator (GEN), 59 that in turn produces blanking control data BC for indicating the interruption of the exposure. The data BC is then supplied to a blanking control circuit 60, and the blanking control circuit 60 drives the deflector 25 via a D/A converter 61 that produces the blanking control signal SB described previously. The clock generator 59 further produces a system clock running at a predetermined rate that determines the throughput of exposure as will be described in detail later.

The sequence controller 62 detects the timing information transferred thereto from the interface circuit 53 and indicating the commencement of the exposure process, and controls the data memory 54 via the pattern generator 55 to output main deflection data MD that is supplied to a deflection control circuit 63. The deflection control circuit 63 produces main deflection control data SD2 in response to the data MD supplied thereto and supplies the data SD2 to a D/A converter 64 where the data SD2 is converted to a deflection control signal S2. This deflection control signal S2 drives the main deflector 33 in the objective lens 32. Further, the deflection control circuit 63 controls a stage position correction circuit 68 in response to the activation thereof by the sequence controller, and the stage position correction circuit 68 drives the deflector 34 via the D/A converter 56 that produces the drive signal S3 as described previously.

In cooperation with the deflection control circuit 63 and the stage position correction circuit 68, the sequence controller 62 activates a stage moving mechanism 66 for moving the stage 35 while monitoring the position of the stage 35 by a laser interferometer 67. Thereby, the exposure of a selected pattern on the mask 20 is made at any desired location on the wafer W.

Next, the exposure process that is achieved by the pattern generator 55 will be described together with its construction.

Figure 4:
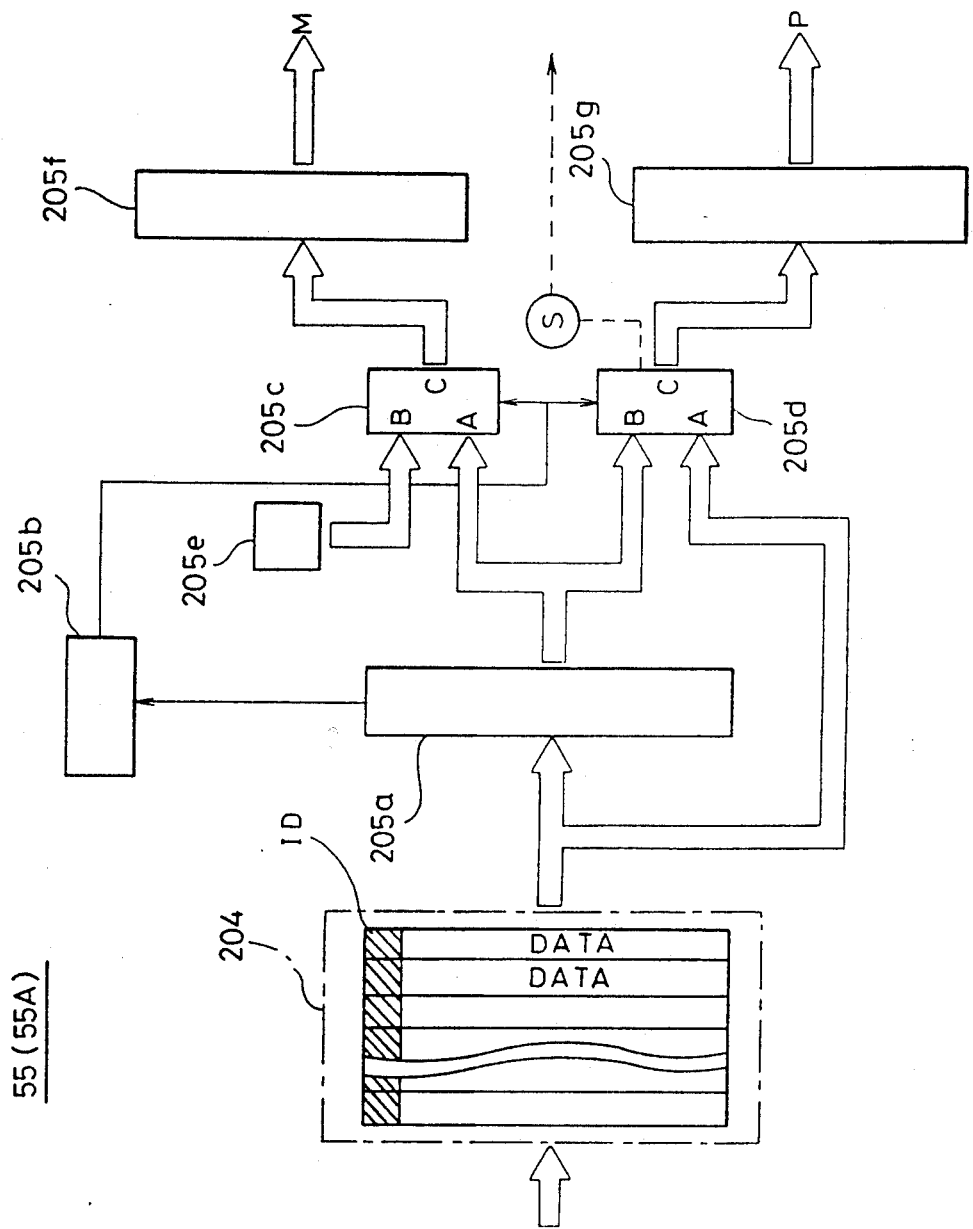
FIG. 4 is a block diagram showing an essential part of the control system that is used in the electron beam exposure system of FIG. 3 for increasing the throughput of exposure.

FIG. 4 is the block diagram showing a first part 55A of the pattern generator 55.

Referring to FIG. 4, the pattern generator 55 includes a FIFO memory 204 to which the pattern data is supplied from the data memory 54. The pattern data includes two types of data, the data P for specifying the pattern to be exposed and the data M for specifying the repetition of the exposure of the same pattern, similar to the prior art described previously. It should be noted that each of the data P and the data M includes a plurality or words and each word in turn includes a plurality of bits. The following table shows the structure of each of the data P and the data M, wherein each data includes five words, and each word in turn includes n bits.

TABLE I

| DATA P | |
| --- | --- |
| WORD 1: | pattern shape information |
| WORD 2: | X-coordinate of pattern origin |
| WORD 3: | Y-coordinate of pattern origin |
| WORD 4: | pattern size in X-direction |
| WORD 5: | pattern size in Y-direction |
| DATA M | |
| WORD 1: | 0 except for the n-th bit |
| WORD 2: | number repeated in X-direction |
| WORD 3: | number repeated in Y-direction |
| WORD 4: | pitch in X-direction |
| WORD 5: | pitch in Y-direction |

As described with reference to the prior art, the data M accompanies the corresponding data P and specifies the repetition of the exposure by the pattern specified by the data P. When the pattern is exposed without repetition, there is no data M accompanying with the data P. Thus, the data is supplied to the FIFO memory 204 from the data memory 54 as a mixture of the data M and the data P, wherein the alternate repetition of the data M and the data P is not guaranteed.

In order to distinguish the data M from the data P, the n-th bit of the first word, WORD 1, is used. More specifically, the n-th bit of the data M is fixed at "0" irrespective of the content of the data. On the other hand, the n-th bit of the first word, WORD 1, of the data P is fixed at "1."

Referring to FIG. 4, the data outputted from the FIFO memory 204 is transferred to a buffer register 205a. In connection with the buffer register 205a, there is provided a bit detection circuit 205b that detects the n-th bit of the first word, WORD 1, of the data held in the buffer register 205a. The data outputted from the buffer register 205a is then supplied to switch circuits 205c and 205d simultaneously, wherein each of the switch circuits 205c and 205d has first and second input ports A and B, and the output of the buffer register 205a is supplied to the port A of the switch circuit 205c and to the port B of the switch circuit 205d.

It should be noted that each of the switch circuits 205c and 205d has an output port and establishes a connection between one of the input ports A and B and the output port C in response to the logic state of a control signal that is supplied thereto from the bit detection circuit 205b. More specifically, there is established a connection between the input port A and the output port C in each of the switch circuits 205c and 205d when the output control signal of the bit detection circuit 205b has a first logic level indicative of the fact that the data M is held in the buffer register 205a. On the other hand, when the output control signal of the bit detection circuit 205b has a second, opposite logic level, there is established a connection between the input port B and the output port C in each of the switch circuits 205c and 205d.

In the illustrated circuit, the buffer register 205a is connected to supply the output thereof to the input port A of the switch circuit 205c and simultaneously to the input port B of the switch circuit 205d. Further, the FIFO memory 204 is connected to the switch circuit 205d to supply the output of the memory 204 to the input port A of the switch circuit 205d. Further, there is provided a dummy data generator 205e for providing dummy data to the input port B of the switch circuit 205c.

When the control signal outputted by the detection circuit 205b has the first logic level in correspondence to the existence of the data M in the buffer register 205a, the data M in the buffer register 205a is supplied to the switch 205c and outputted at the output port C of the switch circuit 205c. The data thus outputted is immediately transferred to an output buffer register 205f that is provided for receiving the data M. Simultaneously with the foregoing transfer of the data M, the data that follows the data M in the buffer register 205a is read out and supplied to the input port B of the switch circuit 205d. There, the data thus supplied to the input port A is immediately outputted at the output port C of the switch circuit 205d and is transferred to an output buffer register 205g that is provided for receiving the data P. It should be noted that the data that follows the data M is always the data P. Thus, the data M and the next data P that follows the data M are stored in the output buffer registers 205f and 205g respectively and are outputted parallel therefrom.

On the other hand, when the control signal from the detection circuit 205b has the second logic level in correspondence to the existence of the data P in the buffer register 205a, the dummy data generator 205e outputs the dummy data to the input port B of the switching circuit 20Sc which in turn outputs same from port C to the output buffer register 205f. Further, the switching circuit 205d outputs the data P that has been held in the buffer register 205a and transferred to the input port B thereof, at the output terminal C, and the data P is immediately transferred to the output buffer register 205g for the data P. As a result of the above operation, the data P and the dummy data are outputted in parallel from the output buffer register 205g and the output buffer register 205f, respectively.

As a result of the foregoing operation, it will be understood that the time sequential mixture of the data M and the data P in the FIFO memory 204 is now converted to the parallel data of P and M that are respectively outputted by the output buffer registers 205f and 205g.

Hereinafter, the timing of operation of the circuit of FIG. 4 will be described with reference to FIG. 5.

Referring to FIG. 5, the pattern data from the data memory 54 is supplied to the FIFO memory 204, where the data is consecutively transferred in the FIFO 204 in response to each of external read clocks RD until it reaches a final stage register 204a, where the pattern data is held in the register 204a in response to a read clock RD1. As already noted, the pattern data in the FIFO memory 204 is a time sequential mixture of the data M and the data P, and thus the final stage register 204a holds either of the data P or data M.

In response to the next read clock RD2, the pattern data in the register 204a is transferred to the buffer register 205a, and the n-th bit of the first word, WORD1, of the pattern data is examined by the bit detection circuit 205b. Further, in response to the result of the examination, the detection circuit 205b controls the switch circuits 205c and 205d as described already. In the illustrated example, the bit detection circuit 205b produces the control signal designated as SEL having the logic value "1" when the register 204a holds the data M therein, while the circuit 205b produces the control signal SEL having the logic value "0" when the register 204a holds the data P therein. Thereby, the switch circuits 205c and 205d are so activated to output the data at the input port A selectively at the output port C thereof in response to the logic value "1" of the control signal SEL produced by the bit detection circuit 205b, while the switch circuits 205c and 205d are activated to output the data at the input port B selectively at the output port C, of each thereof, in response to the logic value "0" of the control signal SEL.

It should be noted that the foregoing activation of the switch circuits 205c and 205d is achieved immediately after the read clock RD2 is supplied. After the activation of the switch circuits 205c and 205d thus achieved, a next read clock RD3 is supplied and the data in the buffer register 205a is transferred either to the buffer register 205f or the buffer register 205g. Thus, when the data held in the buffer register 205a is the data M, the data M is transferred to the buffer register 205f in response to the read clock RD3. Further, in response to the read clock RD3, the data at the final stage register 204a of the FIFO 204 is read out and transferred immediately to the output buffer register 205g via the switch circuit 205d. On the other hand, when the data held in the buffer register 205a is the data P, the data P is transferred to the buffer register 205g in response to the read clock RD3. Simultaneously, the dummy data "0" generated in the dummy data generator 205e is transferred to the output buffer register 205f via the switch circuit 205c.

In the foregoing operation, it will be noted that the conversion of the time sequential mixture of the data P and the data M in the FIFO 204 into the parallel data P and M, that are respectively outputted via the output buffers 205f and 205g, is achieved in response to only two clocks RD2 and RD3. Particularly, the transfer of the data P in the final stage register 204a of the FIFO 204 is achieved directly to the output register 205g, without holding the data in an intervening register for another one clock. Thereby, the time for reading the data P that follows the data M is reduced and the efficiency of the exposure operation of the electron beam exposure system is improved.

FIGS. 6(A)-6(D) show an example of operation of a first part 55A of the pattern generator 55 that was described with reference to FIGS. 4 and 5.

Figure 6A:
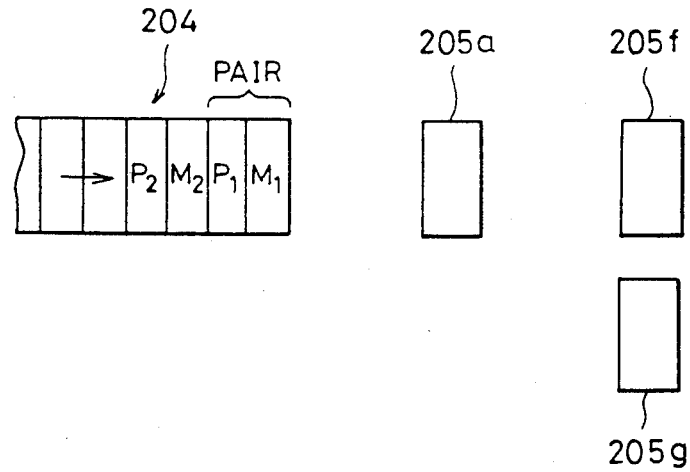
FIGS. 6(A)–6(D) are diagrams showing the operation of the control system shown in FIG. 4 for processing first type data.
Figure 6B:
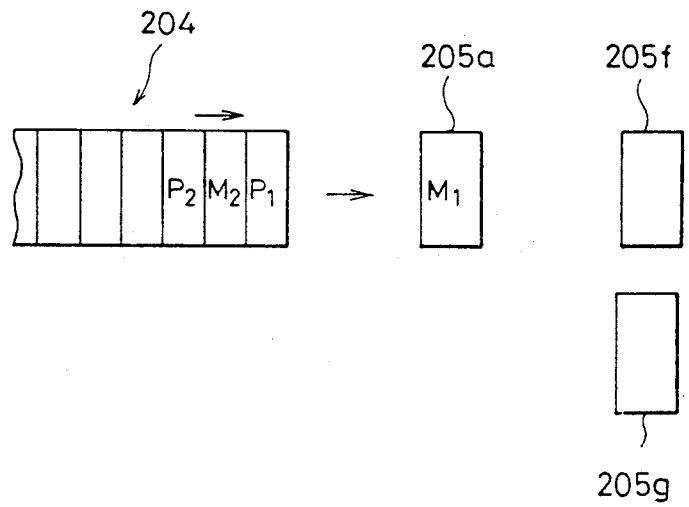
Figure 6C:
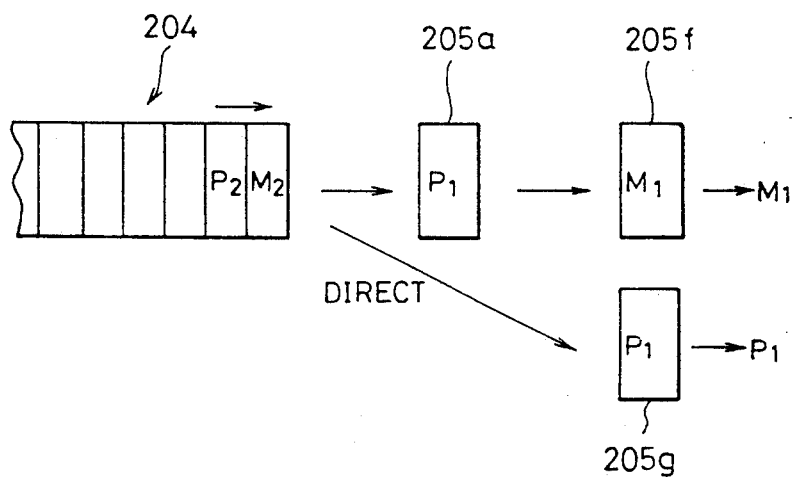
Figure 6D:
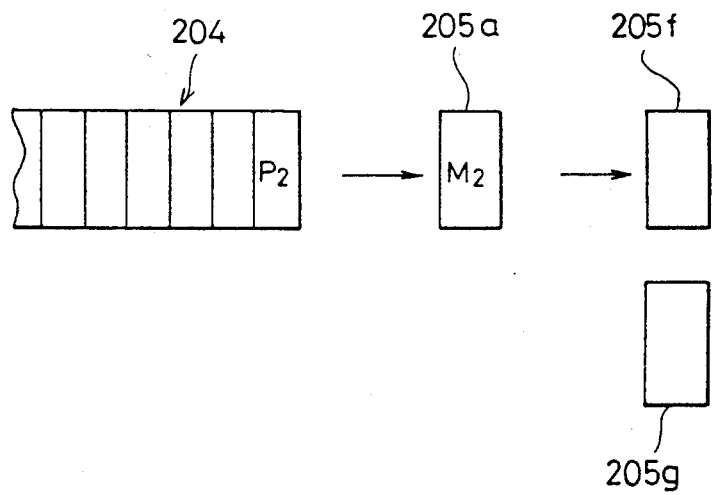

Considering a case wherein a time sequential data train $M_1/P_1/M_2/P_2/$ . . . is supplied to the buffer register 204 from the data memory 54 as shown in FIG. 6(A), with the data $M_1$ at the beginning of the data train, the data $M_1$ is first transferred to the buffer register 205a as shown in FIG. 6(B) in response to a read clock such as the clock RD2. There, the n-th bit of the first word, WORD1, is checked by the bit detection circuit 205b and the switch circuits 205c and 205d are activated in response to the output of the circuit 205b as described already. Thereby, the next data $P_1$ now held in the final stage register 204a of the FIFO 204 is transferred in response to the next clock such as the clock RD3 to the output buffer register 205g directly as shown in FIG. 6(C). After the data $M_1$ and $P_1$ are thus sorted, the next data $M_2$ is transferred to the register 205a as shown in FIG. 6(D) and the process similar to FIG. 6(C) is repeated.

Figure 7A:
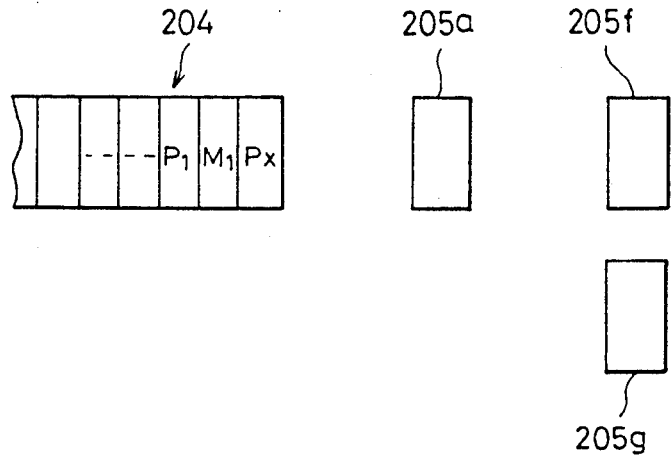
FIGS. 7(A)–7(C) are diagrams showing the operation of the control system of FIG. 4 for processing second type data.
Figure 7B:
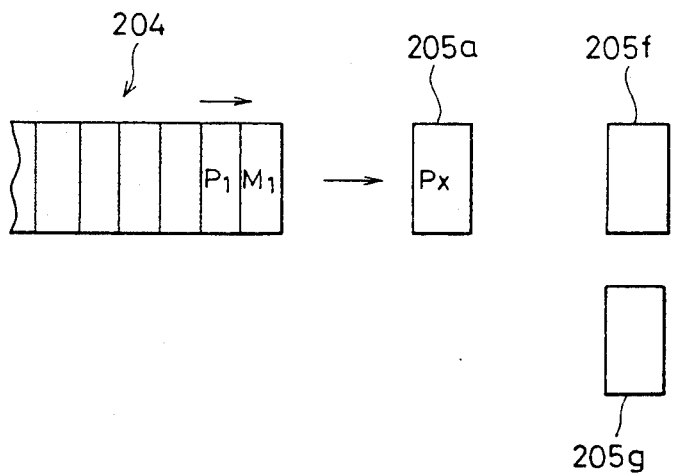
Figure 7C:
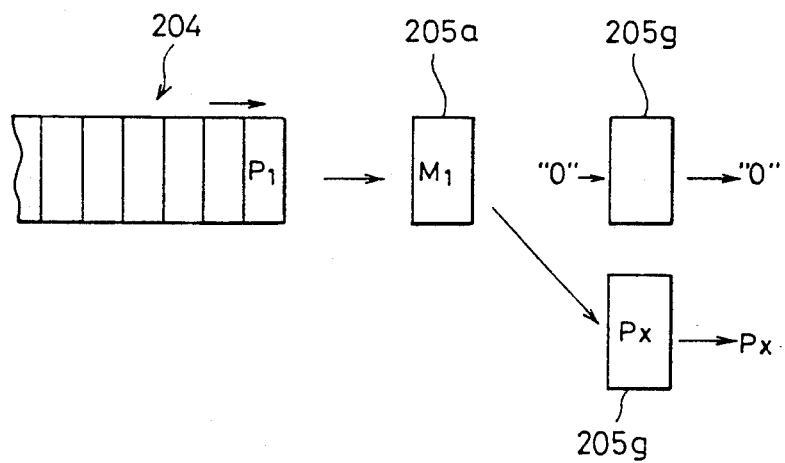

FIGS. 7(A)-7(C) show another example of operation of the first part 55A of the pattern generator 55 for the case where a time sequential data train $Px/M_1/P_1$ . . . is received in from the data memory 54. In this case, the first data Px is not accompanied by any associated, preceding data M in correspondence to the exposure of a single pattern without repetition.

In the step of FIG. 7(A), the above data train enters into the FIFO 204 and the first data Px of the data train is transferred to the register 205a in the step of FIG. 7(B) in response to a read clock such as the clock RD2. Thereby, the bit detection circuit 205b identifies the data Px as the data P and activates the switch circuits 205c and 205d as already described. Thereby, the data Px is transferred to the output buffer circuit 205g in response to the next read clock such as the clock RD3 and the dummy data such as the data 0 of the data generator 205e is transferred to the output buffer register 205f simultaneously as shown in FIG. 7(C).

Generally, the circuit of FIG. 4 achieves the data sorting for the input data train $M_1/P_1/M_2/P_2/P_3/P_4/Mi/Pi$ as:

| data M | 0 | Mi | 0 | 0 | 0 | $M_2$ | 0 | $M_1$ |
| data P | Pi | Pi | $P_4$ | $P_3$ | $P_2$ | $P_2$ | $P_1$ | $P_1$ |

It should be noted that, in the above parallel data train of M and P, there is a dummy data "0" formed after the data pair M and P. For example, there is formed a pair of data "0" and $P_1$, after the data pair $M_1$ and $P_1$. Similarly, a pair of data, "0" and $P_2$, is formed after the data pair $M_2$ and $P_2$. In general, a dummy data pair "0" and Pi are formed immediately after the data pair Mi and Pi. It will be noted that this extra data pair has no meaning in the exposure process, as the designation of the pattern and the number of repetition was already provided by the data pair M and P that precedes the dummy data pair. For example, the data pair "0" and $P_1$ have no meaning, as the pattern $P_1$ is already designated by the preceding data pair $M_1$ and $P_1$. The existence of such a dummy data pair is not only undesirable for the exposure process but also harmful, as the operation of the optical system of the electron beam exposure system according to such a dummy data causes an unwanted exposure of the pattern P1 in addition to the problem of wasting time for processing the dummy data pair. On the other hand, the data pair such as "0" and $P_3$ or "0" and $P_4$ are the data necessary for the exposure.

The cause of this superfluous dummy data pair will be understood from FIG. 6(C) that shows the transfer of the data pair M and P to the respective output registers 205*f* and 205*g*. As shown therein, the data P1 in the final stage register 204*a* of the FIFO 204 is transferred to the register 205*a* simultaneously with the transfer of P1 also to the output register 205*g*. Thereby, the processes similar to FIGS. 7(B) and 7(C) are conducted and the dummy data pair "0" and $P_1$ is inevitably formed after the data pair $M_1$ and $P_1$.

Hereinafter, the construction of the pattern generator 55 for eliminating the unnecessary dummy data pair will be described with reference to FIG. 8.

Figure 8:
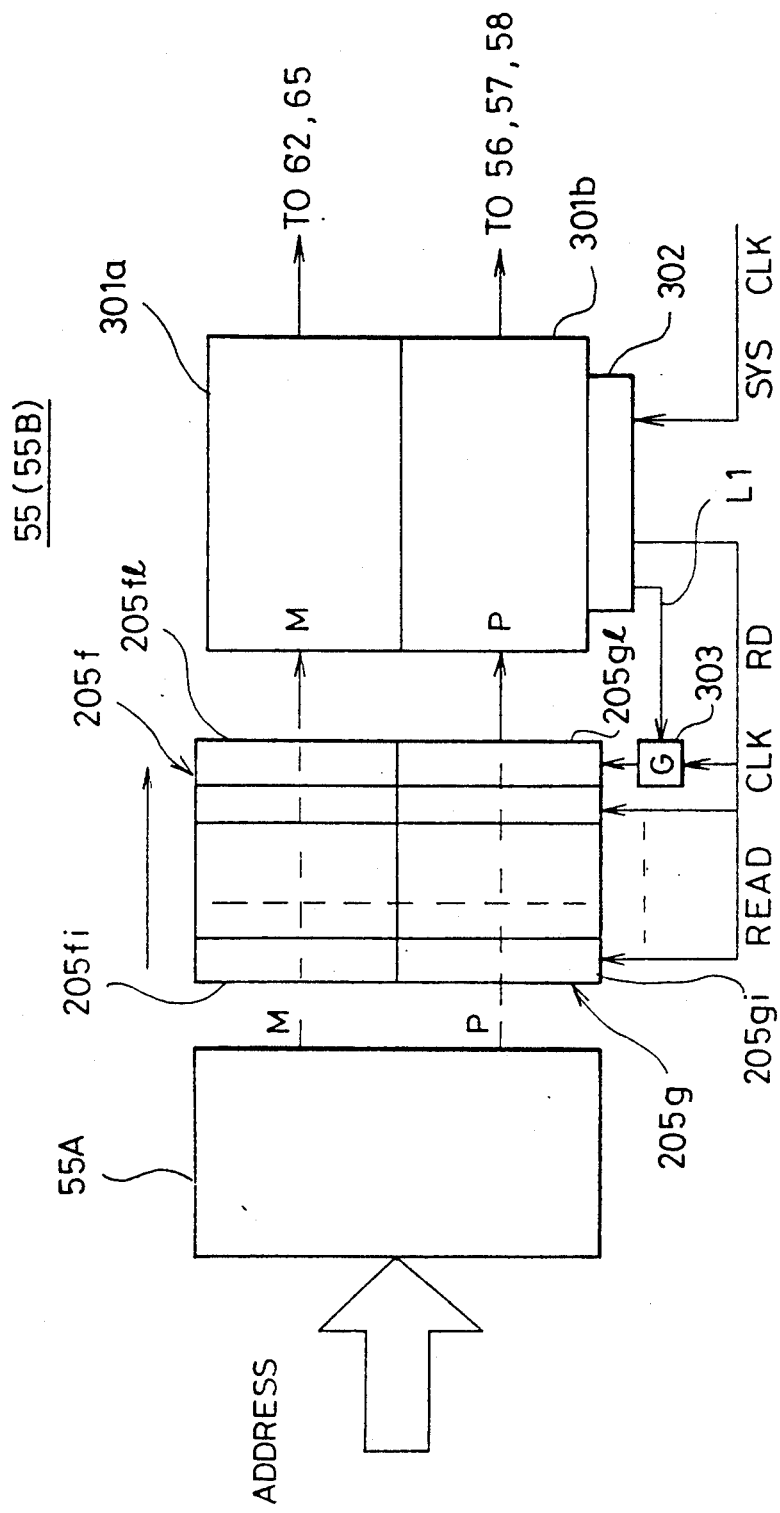
FIG. 8 is a block diagram showing another essential part of the control system used in the system of FIG. 3.

FIG. 8 shows a second part 55B of the pattern generator 55. As shown, the second part 55B is supplied with the output parallel data M and P from the first part 55A at the respective output buffer registers 205*f* and 205*g*, wherein each of the output buffer registers forms a FIFO memory. Thus, the FIFO memory 205*f* includes a number of cascaded registers including an initial stage register 205*fi* and a final stage register 205*fl*. Similarly, the FIFO memory 205*g* includes a number of cascaded registers including an initial stage register 205*gi* and a final stage register 205*gl*.

The FIFO memories 205*f* and 205*g* are supplied with the read clock RD that is the same read clock used for controlling the transfer of the data in the first part 55A, and the data P and the data M are sent consecutively through the FIFOs 205*f* and 205*g* from the first stage of each thereof to the final stage in response to the read clock RD.

In the present embodiment, the output data M of the FIFO register 205*f* is supplied to an output buffer register 301*a* while the output data P of the FIFO register 205*g* is supplied to an output buffer register 301*b*. Further, there is provided a clock generator 302 in cooperation with the output buffer registers 301*a* and 301*b* for producing the read clock RD. There, the clock generator 302 is supplied with the system clock from the clock generator 59 and produces the read clock RD as will be described later.

As already noted, the read clock RD is supplied to each of the register stages of the FIFO memories 205*f* and 205*g* for causing the shifting of the data. There, the registers 205*fl* and 205*gl* at the final stage are supplied with the read clock RD via a gate G circuit 303 that in turn is controlled in response to a control signal produced in the clock generator 302 and supplied via a line L1.

The clock generator 302 produces the control signal on the line L1 such that the gate 302 prohibits the transfer of the read clock RD to the final stage registers 205*fl* and 205*gl* when the data held in the register 301*a* is the data M. Thereby, the data M and the data P held in the FIFO at the stage immediately before the last stage are transferred to the last stage registers 250*fl* and 250*gl* while the data held in the last stage registers are not outputted because of the absence of the drive clock. Thus, the data held at the last stage registers are overwritten by the data M and data P of the previous stage. As a result of the foregoing overwriting, the unwanted dummy data that immediately follows the data pair M and P is overwritten by the next data. When the data held in the register 301*a* is not the data M, on the other hand, the read clock RD is supplied to the final stage registers and the data held therein is outputted to the respective registers 301*a* and the 301*b* in response to the read clock RD.

For example, for the succession of data pair considered previously:

| data M | 0  | Mi | 0     | 0     | 0     | $M_2$ | 0     | $M_1$ |
|--------|----|----|----|----|----|----|----|----|
| data P | Pi | Pi | $P_4$ | $P_3$ | $P_2$ | $P_2$ | $P_1$ | $P_1$ | and when the pair of data $M_1$ and $P_1$ at the beginning of the parallel data train have been entered into the registers 301*a* and 301*b*, the data generator 302 produces the control signal on the line L1 and prohibits the supply of the read clock RD via the gate circuit 303. Thereby, the transfer of the dummy data pair "0" and $P_1$ at the final stage registers 205*fl* and 205*gl* to the registers 301*a* and 301*b* is prohibited because of the lack of the read clock RD that causes the transfer of the data. On the other hand, the clock is supplied to the rest of the stages of the FIFO memories 205*f* and 205*g*, and the data in the rest of the stages are transferred to the respective next stages. Thereby, the data pair $M_2$ and $P_2$ is transferred to the last stage registers 205*fl* and 205*gl* and overwrites the dummy data pair "0" and $P_1$ held therein.

As the data pair Mi and Pi is always followed by the dummy data pair "0" and Pi, one can delete the dummy data pair easily by interrupting the supply of the read clock to the final stage registers 205*fl* and 205*gl* whenever there is data M held in the output buffer register 301*a*. Thereby, one obtains the data train

| data M | 0  | Mi | 0     | 0     | $M_2$ | $M_1$ |
|--------|----|----|----|----|----|----|
| data P | Pi | Pi | $P_4$ | $P_3$ | $P_2$ | $P_1$ | wherein each unnecessary data pair, such as "0" and $P_1$, and "0" and $P_2$, is deleted.

Next, the generation of the read clock RD caused by the clock generator 302 in response to the system clock will be described with reference to FIGS. 9(A) and 9(B).

FIG. 9(A) shows the system clock produced by the clock generator 59. The clock generator 59 produces the system clock at a constant rate and the exposure of the pattern is made in response to each clock pulse of the system clock. Typically, the system clock is produced with a clock rate of 10 MHz.

FIG. 9(B) shows the read clock RD that is produced by the clock generator 302. Each clock pulse of the read clock RD is produced in response to a corresponding clock pulse of the system clock, but wherein the clock generator 302 suppresses the formation of the clock pulse when the output buffer register 301*a* stores the data M therein for a number specified by the data M. More specifically, the formation of the read clock pulse is suppressed for a number corresponding to the number of repetitions of the exposure, reduces by one. It should be noted that the data M specifies the repetition of the exposure of the pattern data that follows thereto. For example, when the data M1 held in the output buffer register 301*a* indicates that the repetition of exposure of the pattern P1 associated with the data M1 be made for five times, the formation of the read clock is skipped for four system clock pulses as illustrated in FIG. 9(B). When the data M2 in the data pair M2 and P2, which follows the data pair M1 and P1, specifies the repetition of the pattern data P2 for two times, the formation of the read clock pulse is skipped for one system clock pulse. On the other hand, when the data M in the output buffer register 301a is the dummy data, the clock generator 302 produces the read clock pulse in response to each system clock pulse.

FIG. 9(C) shows the timing of the exposure that is achieved in response to each clock pulse of the system clock. Each time a data pair M and P such as the data pair M1 and P1 is outputted to the buffer registers 301a and 301b, the data P1 in the buffer register 301a is outputted to the deflectors 17, 21-24 and to the mask driving mechanism 58 for causing the desired shaping of the electron beam. See FIG. 3. On the other hand, the data M1 in the buffer register 301b is outputted to the sequence controller 62 for driving the deflectors 33 and 34 in the objective lens 32 and further for driving the stage 35 for the repetitive exposure of the same pattern on different locations of the wafer W.

When the exposure is repeated for five times in response to each clock pulse of the system clock, the clock generator 302 of FIG. 8 produces the next read clock RD and the pair of data M2 and P2 are transferred to the output registers 301a and 301b, respectively. There, the shaping of the electron beam is achieved according to the data P2, and the exposure is repeated twice in response to each system clock.

When the exposure of the pattern P2 is repeated twice, the clock generator 302 produces the next read clock, and the data P3 and the data M3 forming the next data pair are transferred to the output buffer registers 301a and 301b. As the next data pair has the dummy data for the data M3, the exposure of the pattern P3 is made only once in response to the system clock and the next read clock is generated in response to the system clock pulse. Thereby, the next data pair, i.e., the data P4 and data M4, is transferred to the output buffer registers 301a and 301b. In this case, too, the data M4 contains the dummy data and the exposure of the pattern P4 is made only once in response to the system clock pulse.

As a result of the foregoing exposure process, the efficiency of operation of the electron beam exposure system is improved particularly for the device pattern that includes a number of repetitions of predetermined patterns. Thus, the present invention is particularly effective in mass producing large capacity memories that require submicron patterning processes.

Figure 10:
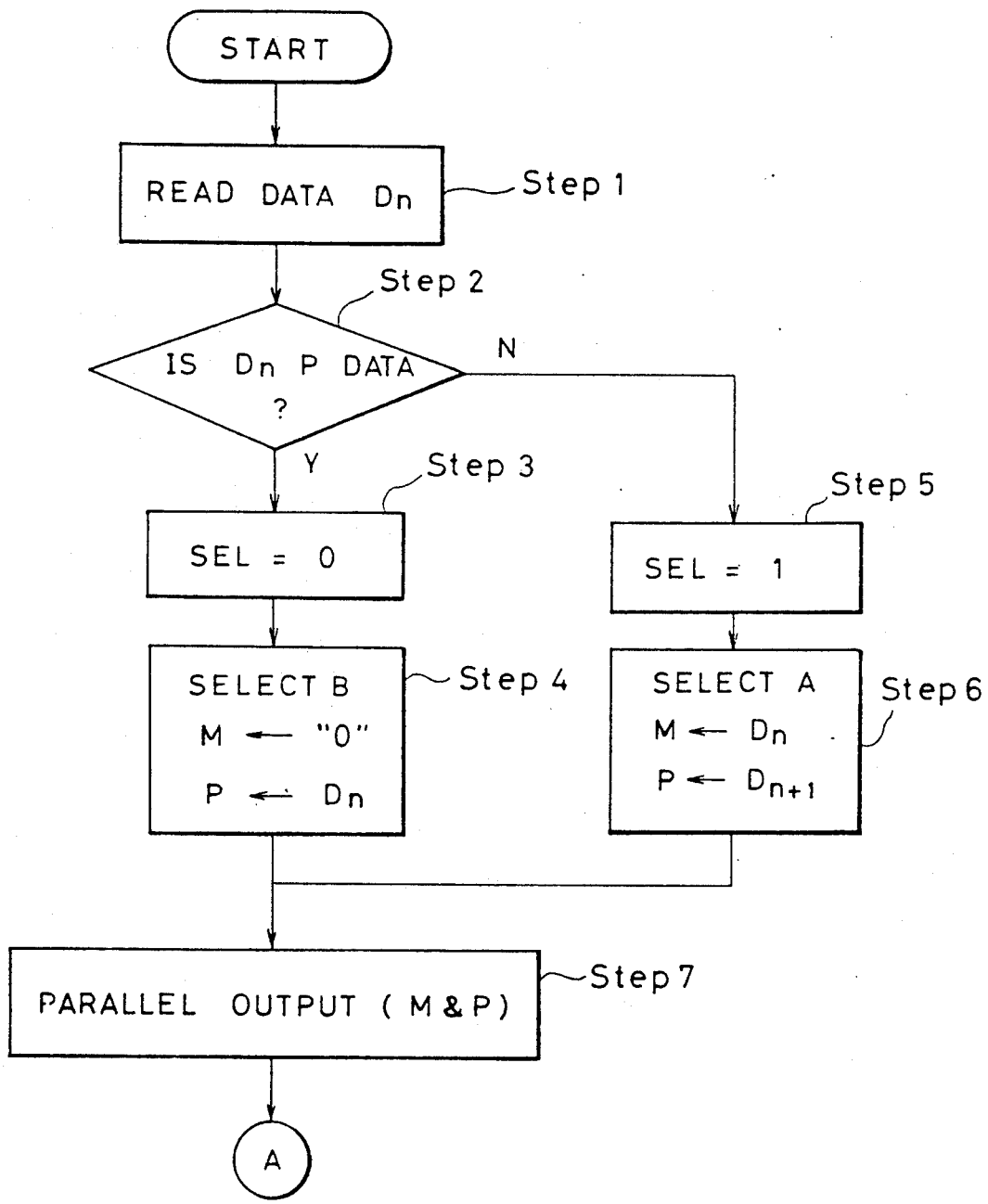
FIGS. 10(A) and 10(B) are flowcharts showing the operation of the electron beam exposure system of FIG. 3.
Figure 10:
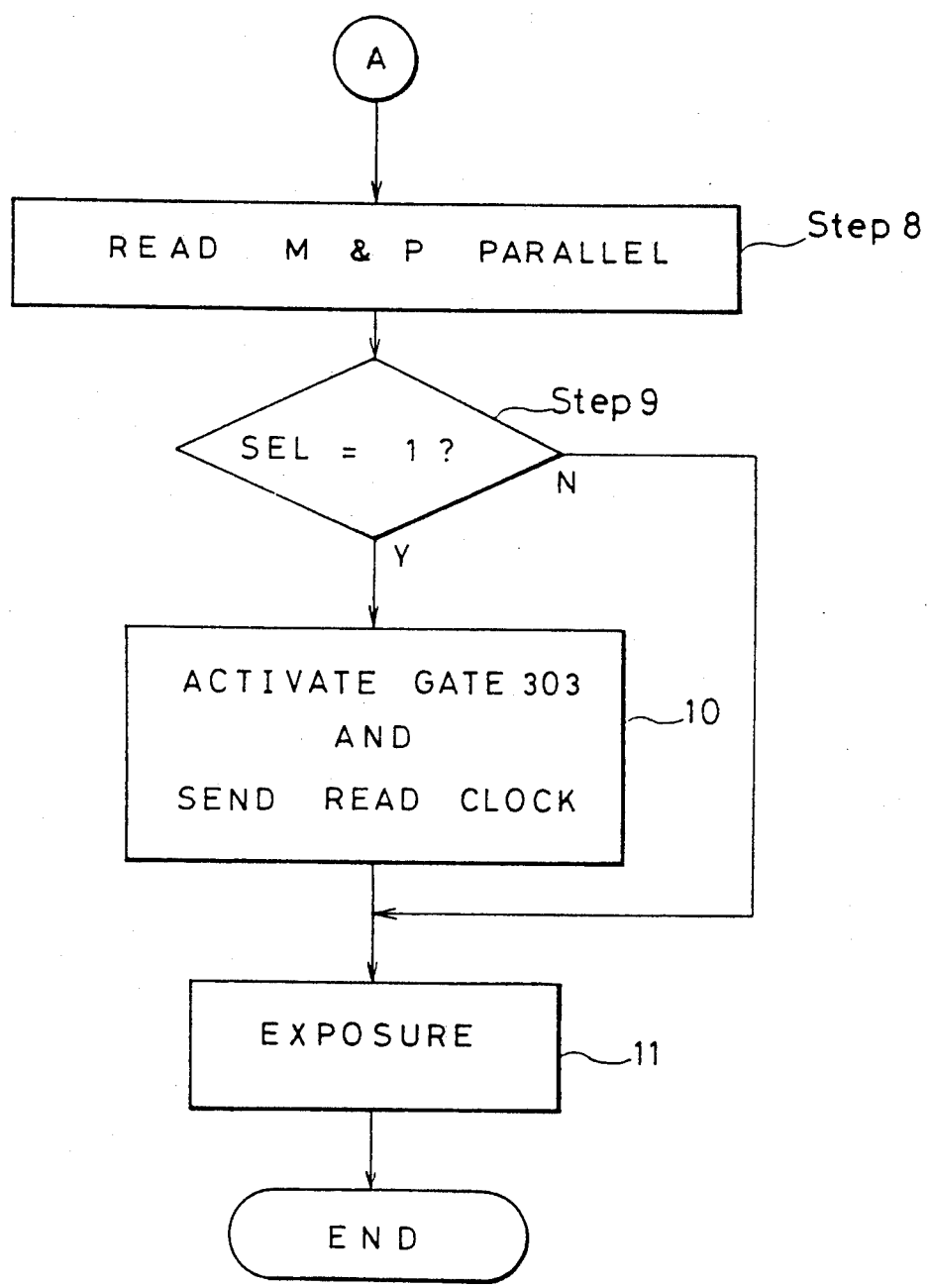

FIG. 10(A) shows the principle of operation achieved in the circuit part 55A of the pattern generator 55 in the form of flowchart.

In the first step 1, the data supplied from the data memory 54 is read by the FIFO 204. In the next step 2, a discrimination is made in the bit detection circuit 205b whether the data Dn belongs to the first type data P or the second type data M. When the data Dn is the data P, the control signal SEL outputted by the circuit 205b is set to the logic level "0," and the input port B is selected for each of the switch circuits 205c and 205d in the step 4. Thereby, the dummy data at the input port B of the switch circuit 205c is outputted to the output buffer register 205f while the data Dn at the input port B of the switch circuit 205d is outputted to the output buffer register 205g.

On the other hand, when it is discriminated in the step 2 that the data Dn belongs to the second type data M, the bit detection circuit 205b produces the output control signal SEL with the logic level "1" in the step 5, and the switch circuits 205c and 205d are controlled in response to the control signal SEL in the step 6 such that the data at the input port A of the switch circuits 205c and 205d is outputted to the corresponding output buffer circuits 205f and 205g. Thus, the data Dn at the input port of the switch circuit 205c is transferred to the output buffer register 205f while the data $D_{n+1}$, that follows the data Dn and is held in the final stage register of the FIFO 204, is transferred to the corresponding output buffer register 205g. Further, in the step 7, the data M and data P respectively held in the output registers 205f and 205g are transferred in parallel for processing by the part 55B of the pattern generator 55.

FIG. 10(B) shows the operation achieved in the circuit part 55B of the pattern generator 55.

In the step 8 that follows the step 7, the parallel data outputted in the step 7 is transferred to the registers 301a and 301b. After the step 8, the content of the register 301a is examined in the step 9 whether the data is the data M or the data P. This may be achieved either by detecting the n-th bit of the data in the register 301a or by using the logic level of the control signal SEL produced by the bit detection circuit 205b.

When it is discriminated in the step 9 that the data in the register 301a is the data M, the gate circuit 303 for interrupting the supply of the read clock to the final stage register of the FIFO registers 205f and 205g is activated in the step 10. This activation of the gate circuit 303 may be achieved about 100 nanoseconds after the read clock RD is produced, for transferring the data in the FIFO memories 205f and 205g to the corresponding registers 301a and 301b. After the gate circuit 303 is activated, the next read clock is supplied. Thereby, the data held by the final stage registers 205f1 and 205g1 of the FIFO is overwritten by the data that is held in the previous stage.

Further, the exposure is achieved in the step 11 based upon the data P and data M. Thereby, an efficient exposure is achieved as already described.

Further, the present invention is not limited to the embodiments described heretofore, but various variations and modifications may be made without departing from the scope of the invention.

What is claimed is:

1. An electron beam exposure system for writing a pattern on an object, comprising:

electron beam source means for producing an electron beam and directing the beam to said object generally along a predetermined optical axis;

beam supplying means provided between said electron beam source means and said object for shaping the electron beam, said beam shaping means comprising a mask having a plurality of apertures for correspondingly shaping the cross-section of the electron beam upon selective passage of the electron beam therethrough and addressing means, supplied with addressing data that specifies a selected aperture, for deflecting the electron beam to pass through the selected aperture;

an optical system provided along said predetermined optical path for focusing the electron beam on the subject and thereby to write on the object a demagnified image of the selected aperture of the mask through which the electron beam has passed;

stage means for holding the object and for moving the held object in a direction perpendicular to said optical axis, said stage means being supplied with said addressing data for moving said object in response thereto;

data generation means for producing said addressing data, said addressing data comprising first addressing data specifying the number of repetitions of writing the image on the object and second addressing data specifying the cross sectional shape of the electron beam, said data generation means producing said addressing data as a time sequential mixture of said first addressing data and said second addressing data; and data sorting means supplied with said addressing data from said data generation means for sorting said first and second addressing data such that said first addressing data and said second addressing data are outputted in parallel and with the same timing when said first addressing data and said second addressing data appear consecutively in said addressing data, said data sorting means supplying said first addressing data to said stage means as said addressing data and further supplying said second addressing data to said addressing means of said beam shaping means as said addressing data.

2. An electron beam exposure system as claimed in claim 1 in which said data sorting means comprises:

discrimination means, supplied with said addressing data from said data generation means, for discriminating whether the addressing data supplied from said data generation means is the first addressing data or the second addressing data and for producing a control signal indicative of whether the data that has been received by the discrimination means is the first addressing data or the second addressing data, said control signal having a first logic level when the data received by the discrimination means is the first addressing data and a second logic level when the data received by the discrimination means is the second addressing data;

bypass bus means, connected to the data generation means, for receiving said addressing data from said data generation means;

first switching means having a first input port and a second input port, said first input port being connected to said discrimination means for receiving the addressing data that has been supplied to the discrimination means from said data generation means and said second input port being connected to said data generation means via said bypass bus means for receiving the addressing data from said data generation means, said first switching means being supplied with said control signal and outputting the data received at said second input port as the second addressing data when said control signal has the first logic level and outputting the data received at said first input port as the second addressing data when said control signal has the second logic level;

dummy data generation means for producing dummy data;

second switching means having a first input port and a second input port, said first input port being connected to said dummy data generation means for receiving the dummy data therefrom and said second input port being connected to said discrimination means for receiving the addressing data therefrom, and said second switching means being supplied with said control signal from said discrimination means for outputting the data received at said second input port as the first addressing data when the control signal has the first logic level and outputting the data received at said first input port as the second addressing data when the control signal has the second logic level.

3. An electron beam exposure system as claimed in claim 1 in which said electron beam exposure system further comprises data compression means, supplied with said addressing data consecutively from said data sorting means, for deleting the addressing data that is received thereby, immediately after said first addressing data and said second addressing data are outputted in parallel from said data sorting means.

4. An electron beam exposure system as claimed in claim 2 in which said data compression means comprises FIFO means, having a plurality of stages including a first stage and a final stage, a first input port for receiving the first addressing data from said data sorting means and a second input port for receiving the second addressing data from said data sorting means, and said FIFO means further being supplied with a read clock, for sending the first addressing data and the second addressing data respectively and consecutively stage by stage from said first stage to said final stage in response to said read clock, said FIFO means further having a first output port connected to said final stage for outputting said first addressing data and a second output port connected to said final stage for outputting said second addressing data.

5. An electron beam exposure system as claimed in claim 4 in which said electron beam exposure system further comprises clock generation means, connected to said first and second output ports of the FIFO means, for producing said read clock each time the second addressing data is outputted from said second output port except when the first addressing data is outputted simultaneously from said first output port, and for prohibiting the read clock from being produced for a number corresponding to the number of repetitions specified by said first addressing data minus one, when said first addressing data is outputted from said first output port, said clock generation means further prohibiting the read clock from being supplied to said final stage of said FIFO means for prohibiting the first and second addressing data from being outputted from said final stage of said FIFO means, while simultaneously sending the read clock to other stages of the FIFO means.

6. An electron beam exposure system as claimed in claim 5 in which said electron beam exposure system further comprises first buffer means connected to said first output port of said FIFO means, said first buffer means being supplied with said read clock for receiving the first addressing data from said final stage of the FIFO means in response to said read clock and holding therein the first addressing data thus transferred; second buffer means connected to said second output port of said FIFO means, said second buffer means being supplied with said read clock for receiving the second addressing data from said final stage of the FIFO means in response to said read clock and holding therein the second addressing data thus transferred; and system clock generation means for producing a system clock, said addressing means and said stage means being activated in response to said system clock for reading the first addressing data and the second addressing data from said first and second buffer means, said system clock having a clock rate equal to or larger than said read clock.

7. A method for exposing a pattern on an object by an electron beam having a selectively shaped cross section, one shot by one shot, comprising the steps of:

generating pattern data that specifies the cross section of the electron beam as a time sequential mixture of first pattern data specifying the number of repetitions of the shots to be made and second pattern data specifying the cross sectional shape of the electron beam, said time sequential mixture lacking the first pattern data when the shot of a given cross section is to be made without repetition;

sorting the first and second pattern data such that said first and second pattern data form parallel data wherein said first pattern data and said second pattern data have the same timing; said step of sorting comprising a step of reading data contained in said time sequential mixture of said first pattern data and said second pattern data, discriminating whether the data that has been read represents the first pattern data or not, outputting the data that has been read as the first pattern data and simultaneously the data that follows immediately behind the data that has been read in the time sequential mixture as the second pattern data when it is discriminated that the data that has been read is the first pattern data; and outputting dummy data as the first pattern data and outputting the data that has been read as the second pattern data when it is discriminated that the data that has been read is the second pattern data; and conducting the shot by the electron beam with the cross sectional shape according to the second pattern data for a number of times that is determined by the first pattern data.

8. A method as claimed in claim 7, further comprising the step of compressing the first and second pattern data by deleting the data that follows immediately after the parallel data that includes the first pattern data.

9. A method for writing a pattern on an object by an electron beam having a selectively shaped cross section based upon a first data train, said first data train being a time sequential mixture of first type and second type data pairs, each first type data pair comprising first type data and second type data, said first type data specifying the desired cross section of the electron beam and said second type data specifying the number of repetitions of writing the pattern on the object by the electron beam of which the cross section thereof is specified by said first type data, and each second type data pair comprising the first type data and a third type data that is different from said second type data, comprising the steps of:

reading a data pair in the first data train;
discriminating as to whether said read data pair is the first type data pair or the second type data pair; and
deleting the data pair that follows immediately behind said read data pair when said read data pair is the first type data pair, to form a second data train; and
writing the pattern on the object according to the second data train.

10. A method of sorting data that is supplied as a time sequential mixture of first type data and second type data, comprising the steps of:

receiving data included in said time sequential mixture;
discriminating whether the received data is the first type data or the second type data;
transferring the received data to a first output bus when it is discriminated in said step of discrimination that said received data is the first type data;
transferring the received data to a second, different output bus when it is discriminated in said step of discrimination that said received data is the second type data; and
transferring data that follows immediately behind said received data, when it is discriminated in said step of discrimination that said received data is the first type data, to said second output bus, said step of transferring said data that follows immediately behind said received data being achieved simultaneously with said step of transferring the first type data to said first output bus.

11. A method for compressing data of a data train comprising a time sequential mixture of first type data pairs and second type data pairs, each of said first type data pairs comprising first type data specifying a desired operation and associated, second type data specifying the number of repetitions of said operation specified by the associated first type data, said second type data pair comprising third type data and said second type data, said method comprises the steps of:

reading a data pair in said data train;
discriminating whether said read data pair is the first type data pair or the second type data pair; and
deleting the data pair that follows immediately behind said read data pair when said read data pair is the first type data pair, to form a second data train that is substantially identical with the first data train except that the data in the first data train that follows immediately behind the first data pair is eliminated.

* * * * *

UNITED STATES PATENT AND TRADEMARK OFFICE
CERTIFICATE OF CORRECTION

PATENT NO. : 5,175,435
DATED : December 29, 1992
INVENTOR(S) : Kiichi SAKAMOTO et al.

It is certified that error appears in the above-indentified patent and that said Letters Patent is hereby corrected as shown below:

Col. 9, line 29, change "port C thereof" to --port C, of each thereof,--.

Col. 10, line 25, delete "in" (first occurrence).

Col. 12, line 13, change "data" to --clock--;
line 58, change "reduces" to --reduced--.

Col. 14, line 49, change "supplying" to --shaping--.

Signed and Sealed this

Twenty-fourth Day of May, 1994

Attest:

BRUCE LEHMAN

*Attesting Officer*  *Commissioner of Patents and Trademarks*